United States Patent [19]

Hayashi et al.

[11] Patent Number: 5,162,892
[45] Date of Patent: Nov. 10, 1992

[54] SEMICONDUCTOR DEVICE WITH POLYCRYSTALLINE SILICON ACTIVE REGION AND HYDROGENATED PASSIVATION LAYER

[75] Inventors: Hisao Hayashi; Hisayoshi Yamoto; Chiaki Sakai, all of Kanagawa, Japan

[73] Assignee: Sony Corporation, Tokyo, Japan

[21] Appl. No.: 703,057

[22] Filed: May 17, 1991

Related U.S. Application Data

[63] Continuation of Ser. No. 396,829, Aug. 21, 1989, abandoned, which is a continuation of Ser. No. 683,932, Dec. 20, 1984, abandoned.

[30] Foreign Application Priority Data

Dec. 24, 1983 [JP] Japan ............................. 58-248972
Mar. 16, 1984 [JP] Japan ............................. 59-38872[U]

[51] Int. Cl.$^5$ .................... H01L 27/12; H01L 21/324
[52] U.S. Cl. ........................................ 257/65; 257/66
[58] Field of Search ................... 357/23.7, 59, 4, 52, 357/2, 54, 23.9

[56] References Cited

U.S. PATENT DOCUMENTS

| | | | |
|---|---|---|---|
| 3,258,663 | 6/1966 | Weimer | 357/23.7 |
| 3,290,569 | 12/1966 | Weimer | 357/23.7 |
| 3,304,469 | 2/1967 | Weimer | 357/59 E |
| 3,514,676 | 5/1970 | Fa | 357/59 |
| 3,549,411 | 12/1970 | Bean et al. | 357/52 |
| 4,282,543 | 8/1981 | Ihara et al. | 357/23.7 |
| 4,365,264 | 12/1982 | Mukai et al. | 357/54 |
| 4,502,202 | 3/1985 | Malhi | 357/23.9 |
| 4,545,112 | 10/1985 | Holmberg et al. | 357/4 |

OTHER PUBLICATIONS

H. Hayashi, T. Noguchi, and T. Oshima, "Polysilicon Super-Thin-Film Transistor" (SFT), Japanese. Journal of Applied Physics, vol. 23, No. 11, Nov. 1984, pp. L819-L820.

*Primary Examiner*—Jerome Jackson, Jr.
*Attorney, Agent, or Firm*—Ronald P. Kananen

[57] ABSTRACT

A thin film semiconductor device with a polycrystalline silicon film forming an active channel region, a source region and a drain region, is encapsulated in a passivation layer which also serves as a source of free hydrogen. Migration of hydrogen into the active region improves the effective carrier mobility, the threshold voltage and the gate voltage of the device by reducing carrier trap density thereof. The passivation layer is activated during annealing to drive hydrogen through porous or transmissive layers of the device to the active region. Effective mobilities of up to 100 cm$^2$/V sec can be achieved in the preferred construction. The semicondcutor device can be fabricated in the form of IC chips.

20 Claims, 2 Drawing Sheets

SEMICONDUCTOR DEVICE WITH POLYCRYSTALLINE SILICON ACTIVE REGION AND HYDROGENATED PASSIVATION LAYER

This application is a continuation of application Ser. No. 07/396,829 filed Aug. 21, 1989, which is a continuation of application Ser. No. 06/683,932, filed Dec. 20, 1984, now abandoned.

BACKGROUND OF THE INVENTION

The present invention relates generally to semiconductor devices and IC chips including the semiconductor devices. More particularly, the invention relates to semiconductor devices having a thin polycrystalline silicon film active layer in which conduction channels of the devices are formed.

Polycrystalline silicon active layers are known to have a higher effective carrier mobility than amorphous silicon layers. In addition, since polycrystalline silicon has greater thermal stability, high temperature processes may be employed for MOS TFT fabrication. Therefore, polycrystalline silicon is considered to be more advantageous than amorphous silicon for use in thin film semiconductor devices. However, on the other hand, polycrystalline silicon has the drawback of charge carrier traps along grain boundaries which results in a relatively high threshold voltage and a relatively high gate voltage required for operation of the finished MOS TFT.

In order to reduce trap density in the polycrystalline silicon layer, conventional MOS TFT's are annealed with hydrogen plasma following fabrication. This conventional process for reducing the trap density requires a relatively long annealing process. This reduces the overall production yield. Furthermore, the plasma itself tends to damage the MOS TFT. In addition, MOS TFT's are normally subjected to bias temperature treatment tests and so forth, during which hydrogen retained in traps in the polycrystalline silicon layer tends to be released by the traps and escape from the silicon layer. As a result, the trap density increases again and degrades the MOS TFT performance.

SUMMARY OF THE INVENTION

Therefore, it is an object of the present invention to provide a semiconductor device with a significantly reduced threshold voltage, a relatively low gate voltage, and a significantly improved effective carrier mobility.

Another and more specific object of the invention is to provide a field effect transistor having a thin polycrystalline silicon active layer with a relative high effective carrier mobility, and relatively low threshold voltage and gate voltage.

A further object of the invention is to provide a process for producing a field effect transistor with a polycrystalline silicon layer, which has an effective carrier mobility matching the characteristics of field effect transistors with a single silicon active layer.

A yet further object of the present invention is to provide an integrated circuit (IC) chip including semiconductor devices, each of which semiconductor devices exhibits improved characteristics.

A still further object of the present invention is to provide a process for producing an IC chip with a plurality of semiconductor devices, such as MOS TFT's.

In order to accomplish the aforementioned and other objects, a semiconductor device, such as a field effect transistor or MOS TFT, according to the present invention, includes a passivation layer extending over a polycrystalline silicon layer, gate electrodes and source and drain electrodes. The passivation layer contains hydrogen which is excited during annealing and migrates into an active region formed in the polycrystalline silicon layer, thus filling traps in the polycrystalline silicon layer. The passivation layer is formed by plasma chemical vapor deposition of a hydrogenated gas, such as a mixture of silane ($SiH_4$) and ammonia ($NH_3$).

In the preferred structure, the polycrystalline silicon layer is substantially thinner than convention polycrystalline silicon layers. In practice, the thickness of the polycrystalline silicon layer in the semiconductor device of the present invention, is in the range of 100 Å to 750 Å.

In accordance with one aspect of the invention, a semiconductor device comprises: a substrate, a polycrystalline silicon layer forming an active region, a source region and a drain region, the polycrystalline silicon layer being deposited on the substrate, a gate electrode formed on the polycrystalline silicon layer above the active region, with an insulating layer interposed between the polycrystalline silicon layer and the gate electrode, electrodes, one connected to each of the source region and the drain region, and a passivation layer deposited over the polycrystalline silicon layer, the gate electrode and the electrodes, the passivation layer containing hydrogen free to migrate during annealing into the polycrystalline silicon layer and fill charge carrier traps in the polycrystalline silicon layer and preventing the trap-filling hydrogen from escaping.

In accordance with another aspect of the invention, a process for fabricating the semiconductor device set forth above, comprises the steps of:

depositing a polycrystalline silicon layer on a substrate;

forming a gate electrode and a gate insulating layer, the latter lying between the polycrystalline silicon layer and the gate electrode;

doping selected areas of the polycrystalline silicon layer to form a source region, a drain region and an active region, the last lying beneath the gate insulating layer;

connecting electrodes to the source region and to the drain region;

depositing a hydrogenated passivation layer over the entire surface of the semiconductor device; and annealing the semiconductor device for exciting the hydrogen in the passivation layer to migrate into the active region of the polycrystalline silicon layer and adhere to charge carrier traps in the polycrystalline silicon layer, thereby reducing the trap density in the active region.

According to a further aspect of the invention, an IC chip comprises a plurality of semiconductor devices, each having a plurality of operating regions including an active region, a passivation layer extending over the semiconductor devices, the passivation layer containing hydrogen which is free to migrate into the active regions and adhere to charge carrier traps in the active regions, thereby reducing the trap density therein, and means defining a path in each semiconductor device through which hydrogen may migrate from the passivation layer to the active region.

BRIEF DESCRIPTION OF THE DRAWINGS

The present invention will be understood more fully from the detailed description given herebelow and from the accompanying drawings of the preferred embodiments of the invention, which, however, should not be taken to limit the invention to the specific embodiments but are for explanation and understanding only.

In the drawings.

DESCRIPTION OF THE PREFERRED EMBODIMENT

Figure 1:
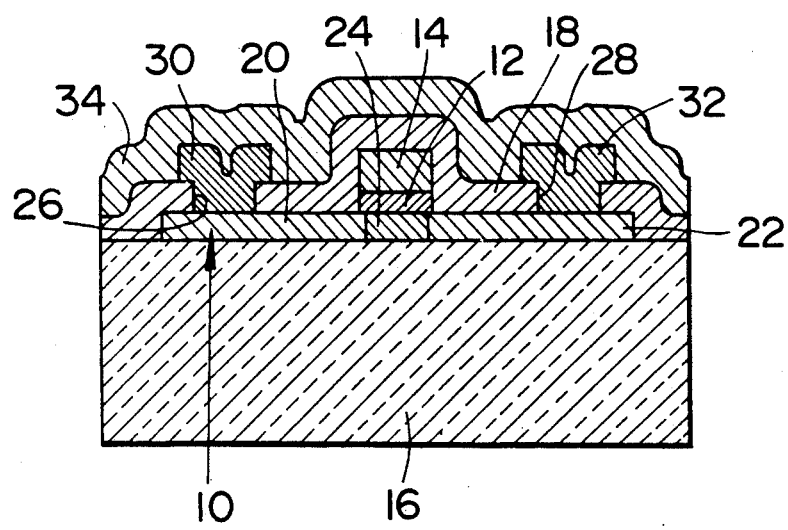
FIG. 1 is a cross-section of the preferred embodiment of a field effect transistor (FET) in accordance with the present invention.

Referring now to the drawings, particularly to FIG. 1, a polycrystalline silicon layer 10, a gate oxide layer 12 of $SiO_2$ and a gate electrode 14 of heavily doped polycrystalline silicon which will be referred to as hereafter as "DOPOS", are formed on a quartz substrate 16. Thereafter, a phosphosilicate glass (PSG) layer 18 is formed over the polycrystalline silicon layer 10 and the gate electrode 14 by chemical vapor deposition (CVD) or other suitable process. After forming the PSG layer 18, the IC is heat treated at approximately 1000° C. to induce thermal diffusion of phosphorous from the PSG layer 18 through the polycrystalline silicon layer 10 to form a $n^+$ source region 20 and a $n^+$ drain region 22 in the layer 10 to either side of the gate electrode 14. The section 24 between the source region 20 and the drain region 22 forms an active region. Openings 26 and 28 are etched through the PSG layer 18 into contact with the source and drain regions, respectively. Input/output terminals 30 and 32 of aluminum are formed around and through the openings 26 and 28.

Subsequent to deposition of the aluminum electrodes 30 and 32, a silicon nitride film 34 is deposited over the entire IC surface in direct contact with the PSG layer 18 and input/output terminals 30 and 32 by chemical vapor deposition using a gaseous mixture of $SiH_4$ and $NH_3$. Then, the finished MOS TFT is annealed at 400° C. to complete the fabrication process.

In this case, the silicon nitride film 34 deposited by plasma chemical vapor deposition serves as a passivation layer and also serves as a source of hydrogen, which will be explained in detail later.

The inventors have performed experiments with annealing processes of varying duration while monitoring the characteristics of the resulting MOS TFT. Specifically, annealing experiments were performed for 60 min, 180 min and 8 hours. The results of these experiments show that the threshold voltage $V_T$ and the gate voltage decrease in direct proportion to the anneal duration. Furthermore, the effective carrier mobility in the active region 24 was significantly increased in all tests.

At a polycrystalline silicon layer thickness of 400 Å, the threshold voltage $V_T$ before annealing was 11 V and the effective mobility was 1 $cm^2$/V sec. After annealing for 8 hours, the threshold voltage $V_T$ dropped to 7 V and the effective mobility rose to 20 $cm^2$/V sec.

Figure 2:
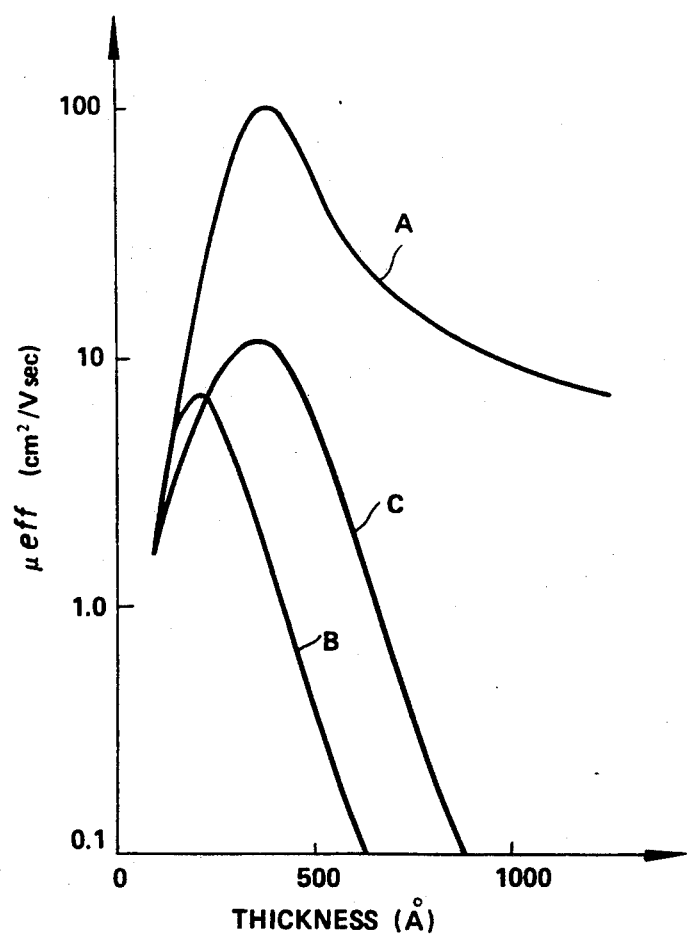
FIG. 2 is a graph of effective carrier mobility versus the thickness of the polycrystalline silicon layer.

The inventors also performed experiments on the thickness of the polycrystalline silicon layer 10 at a fixed anneal duration and temperature, namely 5 hours at 400° C. The behavior of the effective carrier mobility in these experiments is illustrated in FIG. 2. In the inventors' experiments, the thickness of the polycrystalline silicon layer was varied over a range of 100 Å to 1000 Å. The effective mobility $\mu_{eff}$ of the polycrystalline silicon layer in conjunction with a silicon nitride film formed by plasma CVD is represented by line A. Lines B and C in FIG. 2 represent the effective mobility of a thin polycrystalline silicon film without the aid of a plasma CVD-deposited silicon nitride film or annealing. Line C represents the effective mobility of a polycrystalline silicon layer deposited directly to the desired thickness by chemical vapor deposition. On the other hand, line B represents the effective carrier mobility of a polycrystalline silicon layer which is deposited to a greater thickness than desired by chemical vapor deposition and thereafter reduced to the desired thickness by thermal oxidation.

As clearly shown in FIG. 2, forming a silicon nitride film by plasma CVD and thereafter annealing the IC enhances the effective carrier mobility of polycrystalline silicon layer to a level much higher than that of a layer not encapsulated by a silicon nitride film or annealed. In the inventors' experiments, when a 400 Å-thick polycrystalline silicon layer was covered by plasma CVD of a gaseous mixture of $SiH_4$ and $NH_3$ to form silicon nitride film and thereafter annealed at 400° C. for 5 hours, the resultant polycrystalline silicon film had an effective carrier mobility of about 100 $cm^2$/V sec. Although not illustrated in FIG. 2, the effective carrier mobility of a polycrystalline silicon layer between 1000 Å to 3000 Å thick with a vapor-deposited and annealed silicon nitride film is about 6 $cm^2$/V sec to 7 $cm^2$/V sec.

As mentioned previously, the vapor deposition of the silicon nitride film liberates hydrogen which becomes available to the polycrystalline silicon layer. During annealing, the hydrogen contained in the silicon nitride film migrates into the active region of the polycrystalline silicon layer through the PSG layer. Hydrogen supplied to the active region of the polycrystalline silicon layer fills and neutralizes the traps formed in the polycrystalline silicon layer. As a result, the trap density is reduced.

The amount of hydrogen adhering to the traps will be approximately proportional to the duration of the annealing process. This, in turn, means that as the duration of the annealing process increases, the amount of migratory hydrogen increases accordingly to reduce the effective trap density in the polycrystalline silicon layer active region. Reducing the trap density facilitates the movement of excited carriers along the polycrystalline silicon layer and thus results in an increase of the effective carrier mobility. At the same time, the MOS TFT fabricated by the method set forth above has a lower threshold voltage $V_T$ than devices fabricated by conventional methods. Also, the gate voltage required for activation of the MOS TFT can be lowered.

Additionally, in the MOS TFT with the plasma CVD-deposited silicon nitride layer, the hydrogen filling the traps cannot escape the traps even if the fabricated MOS TFT is subjected to high-temperature beta tests. This is due to the encapsulating action of the silicon nitride film. Therefore, the characteristics of MOS TFT's fabricated by the preferred embodiment of the inventive fabrication process will not change after the annealing step, but rather are substantially stable. Furthermore, the silicon nitride film prevents external impurities from invading the MOS TFT structure, and degrading the characteristics of the MOS TFT.

The anneal process required in the preferred embodiment of fabrication process according to the present invention can be carried out in a conventional furnace which can heat-treat a large number of substrates in each cycle of operation. Therefore, even if the annealing process is prolonged in order to achieve a sufficiently high effective carrier mobility, and sufficiently low threshold voltage and gate voltage, there will not be any significantly adverse effect on production time or cost.

In addition to the aforementioned preferred process, the inventors have also performed experiments on polycrystalline silicon layers for which the silicon nitride deposition step is replaced by an annealing step in the presence of a forming gas ($H_2/N_2$). It has been observed that effective carrier mobility and other properties can be improved by prolonging the anneal up to 180 min. When the anneal duration exceeds 180 min, the characteristics of the active region of the polycrystalline silicon layer begin to degrade in proportion to the anneal time. This time optimization may reflect a balance between the hydrogen concentration of the forming gas and dangling bonds in the polycrystalline silicon layer.

Furthermore, in accordance with the aforementioned preferred embodiment of the MOS TFT according to the present invention, the polycrystalline layer is substantially thinner than conventional polysilicon layers. For instance, experiments reveal an acceptable thickness range between about 20 Å to 1000 Å. This is compared with a thickness of more than 1500 Å in conventional polycrystalline silicon layers. This novel approach is warranted by the inventors' discovery that the effective carrier mobility $\mu_{eff}$ of the polycrystalline silicon film or layer is significantly enhanced within a specific range of thickness thinner than is conventionally considered to be practical. The inventors have observed that the effective carrier mobility in this specific thickness range is much higher than typically expected. This fact has not been exploited before because it has been generally been believed that the effective mobility of a thin polycrystalline silicon film or layer is almost independent of thickness in films thinner than 1500 Å. The aforementioned experimental results indicate that effective mobility becomes much greater than conventionally assumed in a range of thickness far thinner than is used conventionally.

Therefore, according to the present invention, a polycrystalline silicon film or layer in the specific range of thickness, i.e. about 100 Å to 750 Å is preferred. A more preferable range of polycrystalline silicon layer thickness is about 200 Å to 750 Å. The range of about 200 Å to 500 Å, within which the maximum effective carrier mobility $\mu_{eff}$ is achieved, is best of all.

It should be appreciated that even though a specific annealing temperature, i.e. 400° C., has been designated in the shown embodiment, the process may be performed at various temperatures. However, on the other hand, it should be noted that if the anneal temperature is too low, significant improvement of the MOS TFT characteristics can not be expected. On the other hand, an excessive high annealing temperature is difficult to realize. Therefore, the preferred range of annealing temperature is about 300° C. to 500° C. Furthermore, in the shown embodiment, the PSG layer is shown deposited over the entire surface of the MOS circuit, but this structure is not essential. For example, the PSG layer may only cover a limited area, e.g., only above the active region of the polycrystalline silicon layer. In a further modification, the PSG layer can be omitted entirely, with silicon nitride film deposited directly onto the gate electrode and polycrystalline silicon layer.

Figure 3:
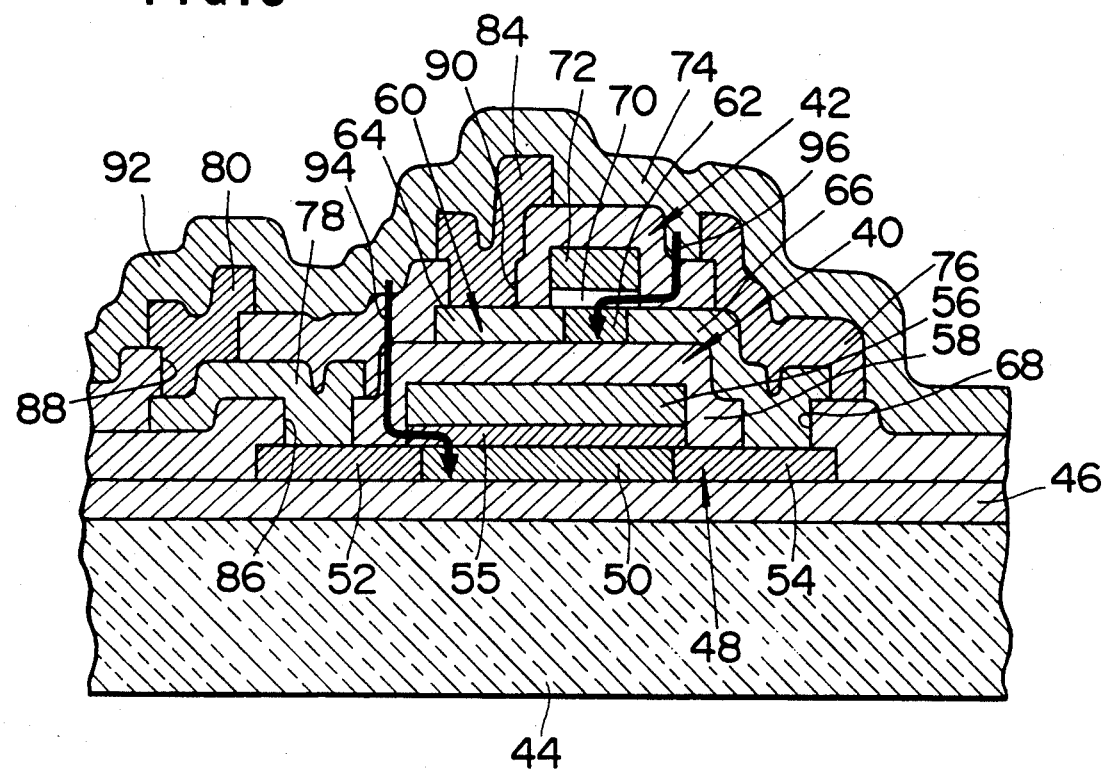
FIG. 3 is a cross-section of a C-MOS inverter employing MOS thin film transistor (TFT) geometry according to the present invention.

FIG. 3 shows an IC circuit to which another embodiment of the semiconductor devices according to the present invention is applied. In the shown embodiment, two MOS TFT 40 and 42 are arranged three-dimensionally on a quartz substrate 44 to form a C-MOS inverter.

A silicon dioxide ($SiO_2$) layer 46 is formed on the quartz substrate 44. On the silicon dioxide layer 46, a first-level, n-channel MOS TFT is formed. The first level n-channel MOS TFT 40 has a polycrystalline silicon layer 48 forming an active region 50 between a source region 52 and a drain region 54 as in the first embodiments. The source region 52 and the drain region 54 are formed by doping the polycrystalline layer 48 with n-type impurities such as arsenic (As), to form an N+ region. A gate insulating layer 55 made of silicon dioxide is deposited on the polycrystalline layer 48 so as to fully cover the active region 50. A highly doped polycrystalline silicon (DOPOS) gate electrode 56 is deposited over the gate insulating layer 55. The MOS TFT 40 thus formed is fully covered by a silicon dioxide insulating layer 58. A second level, p-channel MOS TFT 42 is formed above the silicon dioxide insulating layer 58. As in the first-level transistor, the second level, p-channel MOS TFT has a polycrystalline silicon layer 60 forming an active region 62 between a source region 64 and a drain region 66. The source region 64 and the drain region 66 are induced by a p-type dopant, such as boron (B). The drain region 66 extends through an opening 68 formed through the silicon dioxide insulating layer 58 so as to come into direct contact with the drain region 52 of the first-level, n-channel MOS TFT 40. A silicon dioxide gate insulating layer 70 is deposited on the polycrystalline silicon layer 60 so as to cover the active region 62. A gate electrode 72 made of highly doped polycrystalline silicon (DOPOS) is deposited on the insulating layer 70. This second-level structure is then covered by another $SiO_2$ insulating layer 74.

An aluminum electrode 76 is formed in contact with the drain region 66 of the second-level MOS TFT 42. A section of the polysilicon layer lying on top of the source region 52 is doped heavily enough to serve as an electrode 78. The electrode 78 is in contact with a second-level aluminum electrode 80. Similarly, the source electrode 64 of the MOS TFT 42 is in contact with an aluminum electrode 84. As can be seen in FIG. 3, the electrode 78 extends through an opening 86 etched through the insulating layer 58 and the aluminum electrode 80 extends through an opening 88 etched through the insulating layer 74. Similarly, the aluminum electrode 84 extends through an opening 90 formed through the insulating layer 74.

In this circuit geometry, the active region 50, the source region 52 and the drain region 54 define the dynamic range of the MOS TFT 40. Similarly, the active region 62, the source region 64 and the drain region 66 define the dynamic range of the second-level MOS TFT 42.

A silicon nitride film 92 is deposited over the insulating layer 74 and the aluminum electrodes 76, 80 and 84. The silicon nitride film or layer 92 is formed in substantially the same way as described with respect to the first embodiment. For instance, the silicon nitride layer may be formed by plasma CVD of a mixture of gaseous SiH$_4$ and NH$_3$ reagents. The silicon nitride layer 92 thus formed serves as passivation layer over the MOS TFT's 40 and 42. Also, the silicon nitride layer 92 serves as a hydrogen source for the active regions 50 and 62 as described with respect to the first embodiment.

Figure 4:
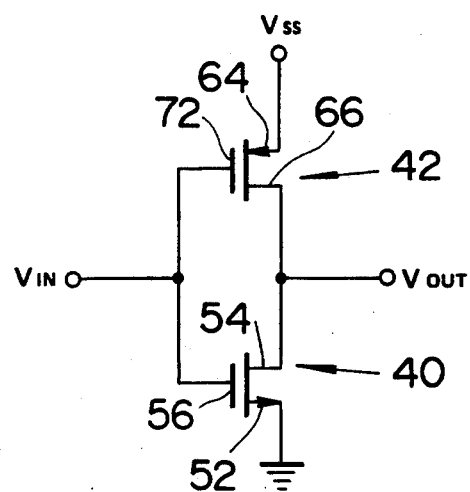
FIG. 4 is a circuit diagram of the C-MOS inverter of FIG. 3.

FIG. 4 is a circuit diagram of the C-MOS inverter described above. The aluminum electrode 80 connected to the source region 52 of the first-level, n-channel MOS TFT via the electrode 78 is connected to ground. On the other hand, the aluminum electrode 84 connected to the source region 64 of the second-level, p-channel MOS TFT 42 is connected to the power source Vss. An input signal V$_{IN}$ is applied to the gate electrodes 56 and 72 of the first-level, n-channel MOS TFT 40 and the second-level, p-channel MOS TFT 42. The aluminum electrode 76 which is connected to the drain regions 54 and 66 of the first- and second-level MOS TFT's 40 and 42 serves as an output terminal for the output voltage V$_{OUT}$ of the C-MOS inverter.

It should be appreciated that as in first embodiment, the polycrystalline silicon layers forming the active regions 50 and 62 are designed to between about 100 Å and 750 Å thick, preferably between 200 Å and 500 Å thick, in order to achieve a high effective carrier mobility $\mu_{eff}$, and low threshold voltage V$_t$ and gate voltage.

In the geometry set forth above in which the MOS TFT's are stacked in two vertical levels, the area required for the C-MOS inverter is much smaller than would be required for the same MOS TFT's on the same plane.

According to the shown embodiment, the first-level, n-channel MOS TFT 40 and the second-level, p-channel MOS TFT 42 are offset vertically, but not horizontally, and the planar area of the second-level, p-channel MOS TFT 42 is smaller than that of the first-level, n-channel MOS TFT 40. The arrangement shown in FIG. 3 must still provide paths 94, 96 by which hygrogen contained in the silicon nitride layer 92 can migrate into the active region 50 of the first-level MOS TFT 40 and the active region 62 of the second-level MOS TFT 42. Each path 94 and 96 is represented by an arrow in FIG. 3.

As will be appreciated from FIG. 3, the part of the source region 52 of the polycrystalline silicon layer 48 of the first-level MOS TFT 40 between the gate electrode 56 and the electrode 78 opposes the silicon nitride layer 92 via the insulating layers 58 and 74. This is the hydrogen migration path 94 for the active region 50. The path 96 through the insulating layer 74 is delimited by the gate electrode 72 and the aluminum electrode 76.

The C-MOS inverter fabricated as set forth above is annealed after deposition of the nitride layer 92. During the annealing process, the hydrogen within the silicon nitride envelope 92 is excited and migrates along the paths 94 and 96 into the active regions 50 and 62 of the first-level and second-level MOS TFT's 40 and 42. The hydrogen entering the active regions 50 and 62 is retained by carrier traps in the polycrystalline silicon layer forming the active regions. The trapped hydrogen neutralizes the filled traps and thus reduces the effective trap density in the active region. As in the first embodiment, the cumulative trap neutralization of this effect will be approximately proportional to the anneal time. In the preferred embodiment, the annealing process is performed at a temperature of 400° C. for 8 hours. This treatment significantly increases the effective carrier mobility $\mu_{eff}$ of the active regions with respect to the first embodiment of the invention. The threshold voltage V$_T$ and gate voltage are lowered at the same time, so that the overall performance characteristics of the C-MOS inverter are significantly improved.

In the shown second embodiment, the geometry of the first-level and second-level MOS TFT is not limited to the shown arrangement. The essential feature of this embodiment is to define paths for hydrogen migration from the silicon nitride layer to ensure enhancement of the characteristics of the MOS TFT during annealing. Therefore, any arrangement of the multi-level MOS TFT's would be possible as long as paths for hydrogen migration can be defined in the manner set forth above.

Furthermore, the invention may also be applied to any IC circuits which employ MOS or bipolar thin-film transistors.

Therefore, the invention fulfills all of the objects and advantages sought therefor.

It should be appreciated that the present invention can be embodied in many ways. The specific embodiments disclosed are to be regarded as mere examples for facilitating full understanding of the principle of the invention. Therefore, the invention should be understood as to include all possible embodiments within principles set out in the appended claims.

What is claimed is:

1. A semiconductor device comprising:
   a substrate;
   a polycrystalline silicon layer having a thickness in a range of from 100 Angstroms to 1000 Angstroms and being in the form of a thin film and forming an active region, a source region and a drain region, said polycrystalline silicon layer being disposed on said substrate;
   a gate electrode formed on said polycrystalline silicon layer above said active region, with an insulating layer interposed between said polycrystalline silicon layer and said gate electrode;
   a doped insulating layer disposed on said polycrystalline silicon layer and said gate electrode;
   electrodes, one connected to each of said source region and said drain region through openings located in said insulating layer; and
   a hydrogenated nitride passivation layer comprising silicon nitride and disposed on said insulating layer and said electrodes, said passivation layer containing hydrogen therein, a part of said hydrogen being free during subsequent annealing to migrate into said polycrystalline silicon layer and fill charge carrier traps in said polycrystalline silicon layer and, subsequent to annealing, said passivation layer preventing said trap-filling hydrogen from escaping at elevated temperatures, wherein the effective mobility for the entire thickness range of said polycrystalline silicon layer is greater than about 10 cm$^2$/V sec.

2. The semiconductor device as set forth in claim 1, wherein said passivation layer is a silicon nitride layer deposited by plasma chemical vapor deposition process using a mixture of hydrogenated reagent gases.

3. The semiconductor device as set forth in claim 2, wherein said reagent gases are silane (SiH$_4$) and ammonia (NH$_3$).

4. A semiconductor device comprising:
   an insulating substrate;

a polycrystalline silicon layer being between 100 Angstroms and 750 Angstroms thick and forming an active region, a source region and a drain region, said polycrystalline silicon layer being disposed on said substrate;

a gate electrode formed on said polycrystalline silicon layer above said active region, with an insulating layer interposed between said polycrystalline silicon layer and said gate electrode;

a doped insulating layer disposed on said polycrystalline silicon layer and said gate electrode;

electrodes, one connected to each of said source region and said drain region through openings located in said insulating layer; and a passivation layer comprising silicon nitride and disposed on said insulating layer and said electrodes, said passivation layer containing hydrogen therein, a part of said hydrogen being free during subsequent annealing to migrate into said polycrystalline silicon layer and fill charge carrier traps in said polycrystalline silicon layer and, subsequent to annealing, said passivation layer preventing said trap-filling hydrogen from escaping at elevated temperatures.

5. The semiconductor device as set forth in claim 4, wherein said polycrystalline silicon layer is 100 Å to 600 Å thick.

6. The semiconductor device as set forth in claim 5, wherein said polycrystalline silicon layer is 200 Å to 500 Å thick.

7. The semiconductor device as set forth in claim 4, wherein said passivation layer comprises a silicon nitride layer deposited by plasma chemical vapor deposition using a mixture of silane ($SiH_4$) and ammonia ($NH_3$).

8. An IC circuit comprising:
a plurality of semiconductor devices fabricated on a substrate, each of said devices having a polycrystalline silicon semiconductor film layer having a thickness in a range of 100 Angstroms to 750 Angstroms, each having a plurality of operating regions including an active region;

a passivation layer as the uppermost film on said semiconductor devices, comprising silicon nitride and extending over said semiconductor devices, said passivation layer containing hydrogen therein, a part of said hydrogen being free during subsequent annealing to migrate into said active regions and adhere to charge carrier traps in said active regions, thereby reducing the trap density therein; and means defining a path in each semiconductor device through which hydrogen may migrate from said passivation layer to said active region.

9. The IC chip as set forth in claim 8, wherein said path is defined through one or more insulating layers, through which at least one of said operating regions opposes said passivation layer.

10. The IC chip as set forth in claim 9, wherein said passivation layer comprises a silicon nitride layer formed by plasma chemical vapor deposition.

11. The IC chip as set forth in claim 10, wherein said silicon nitride layer is deposited upon reaction of two hydrogenated reagents.

12. The IC chip as set forth in claim 11, wherein said reagents are silane ($SiH_4$) and ammonia ($NH_3$).

13. The IC chip as set forth in claim 12, wherein said polycrystalline silicon layer is between 200 Å and 500 Å thick.

14. A semiconductor device comprising:
an insulating substrate;
a polycrystalline silicon layer in form of a thin film of a thickness in a range not thinner than 100 Angstroms and not thicker than 750 Angstroms having hydrogen-filled charge carrier traps and forming an active region, a source region and a drain region, said polycrystalline silicon layer being disposed on said substrate;

a gate electrode formed on said polycrystalline silicon layer above said active region, with an insulating layer interposed between said polycrystalline silicon layer and said gate electrode;

a doped insulating layer disposed on said polycrystalline silicon layer and said gate electrode;

electrodes, one connected to each of said source region and said drain region through openings etched in said insulating layer; and a passivation layer comprising silicon nitride and disposed on said insulating layer and said electrodes, said passivation layer containing hydrogen therein, a part of said hydrogen having migrated during annealing into said polycrystalline silicon layer to fill charge carrier traps in said polycrystalline silicon layer, said passivation layer preventing said trap-filling hydrogen from escaping at elevated temperatures.

15. The device as set forth in claim 1, wherein said part of said hydrogen in said passivation layer is migratory hydrogen, the amount of which increases approximately proportionally to the duration of the annealing process to reduce the effective trap density in the polycrystalline silicon layer active region, thus to facilitate the movement of excited carriers along the polycrystalline silicon layer to result in an increase of the effective carrier mobility of the device.

16. The device as set forth in claim 4, wherein said part of said hydrogen in said passivation layer is migratory hydrogen, the amount of which increases approximately proportionally to the duration of the annealing process to reduce the effective trap density in the polycrystalline silicon layer active region, thus to facilitate the movement of excited carriers along the polycrystalline silicon layer to result in an increase of the effective carrier mobility of the device.

17. The device as set forth in claim 8, wherein said part of said hydrogen in said passivation layer is migratory hydrogen, the amount of which increases approximately proportionally to the duration of the annealing process to reduce the effective trap density in the polycrystalline silicon layer active region, thus to facilitate the movement of excited carriers along the polycrystalline silicon layer to result in an increase of the effective carrier mobility of the device.

18. The device as set forth in claim 14, wherein said part of said hydrogen in said passivation layer is migratory hydrogen, the amount of which increases approximately proportionally to the duration of the annealing process to reduce the effective trap density in the polycrystalline silicon layer active region, thus to facilitate the movement of excited carriers along the polycrystalline silicon layer to result in an increase of the effective carrier mobility of the device.

19. A semiconductor device comprising:
a substrate;

a polycrystalline silicon layer in the form of a thin film having a thickness in a range of 100 Angstroms to 1000 Angstroms and having hydrogen-filled charge carrier traps and forming an active region, a source region and a drain region, said polycrystalline silicon layer being disposed on said substrate;

a gate electrode formed on said polycrystalline silicon layer above said active region, with an insulating layer interposed between said polycrystalline silicon layer and said gate electrode;

a doped insulating layer disposed on said polycrystalline silicon layer and said gate electrode;

electrodes, one connected to each of said source region and said drain region through openings in said insulating layer; and a hydrogenated nitride passivation film layer comprising silicon nitride and disposed on said insulating layer and said electrodes, said passivation layer containing hydrogen therein, a part of said hydrogen having migrated during annealing into said polycrystalline silicon layer to fill charge carrier traps in said polycrystalline silicon layer, said passivation layer preventing said trap-filling hydrogen from escaping at elevated temperatures, said polycrystalline silicon layer exhibiting an effective mobility greater than about 10 $cm^2/V$ sec. over then entire layer thickness range.

20. An IC circuit comprising:

a plurality of semiconductor devices fabricated on a substrate each of said devices having a polycrystalline silicon semiconductor film layer with a thickness in a range of 100 Angstroms to 750 Angstroms, each having a plurality of operating regions including an active region having hydrogen-filled charge carrier traps;

a passivation layer as the uppermost film on said semiconductor devices, comprising silicon nitride and extending over said semiconductor devices, said passivation layer containing hydrogen therein, a part of said hydrogen having migrated during annealing into said active regions and having adhered to said charge carrier traps in said active regions, thereby reducing the trap density therein; and means defining a path in each semiconductor device through which hydrogen can migrate from said passivation layer to said active region.

* * * * *